United States Patent
Manning (10) Patent No.: US 9,064,728 B2
(45) Date of Patent: Jun. 23, 2015

(54) METHOD AND APPARATUS FOR FABRICATING A MEMORY DEVICE WITH A DIELECTRIC ETCH STOP LAYER

(75) Inventor: H. Montgomery Manning, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 2127 days.

(21) Appl. No.: 11/492,138

(22) Filed: Jul. 24, 2006

(65) Prior Publication Data

US 2006/0258164 A1 Nov. 16, 2006

Related U.S. Application Data

(62) Division of application No. 10/832,688, filed on Apr. 27, 2004, now Pat. No. 7,141,511.

(51) Int. Cl.
*H01L 29/40* (2006.01)
*H01L 27/105* (2006.01)
*H01L 27/108* (2006.01)

(52) U.S. Cl.
CPC ......... *H01L 27/105* (2013.01); *H01L 27/10814* (2013.01); *H01L 27/10885* (2013.01); *H01L 27/10888* (2013.01); *H01L 27/10894* (2013.01); *H01L 27/1052* (2013.01)

(58) Field of Classification Search
USPC .......................... 257/773, 295, E21.575, 733
See application file for complete search history.

(56) References Cited

U.S. PATENT DOCUMENTS

| | | |
|---|---|---|
| 5,055,426 A | 10/1991 | Manning |
| 5,175,527 A | 12/1992 | Ishiguro et al. |
| 5,266,523 A | 11/1993 | Manning |
| 5,292,676 A | 3/1994 | Manning |
| 5,390,143 A | 2/1995 | Manning |
| 5,405,788 A | 4/1995 | Manning et al. |
| 5,541,137 A | 7/1996 | Manning et al. |
| 5,549,130 A | 8/1996 | Schuster |
| 5,600,153 A | 2/1997 | Manning |
| 5,650,655 A | 7/1997 | Dennison et al. |
| 5,677,241 A | 10/1997 | Manning |
| 5,681,778 A | 10/1997 | Manning |
| 5,691,565 A | 11/1997 | Manning |
| 5,729,055 A | 3/1998 | Manning |
| 5,736,437 A | 4/1998 | Dennison et al. |
| 5,744,846 A | 4/1998 | Batra et al. |
| 5,756,394 A | 5/1998 | Manning |
| 5,773,346 A | 6/1998 | Manning |
| 5,801,087 A | 9/1998 | Manning et al. |
| 5,812,441 A | 9/1998 | Manning |
| 5,843,814 A | 12/1998 | Manning |
| 5,856,703 A | 1/1999 | Manning |

(Continued)

*Primary Examiner* — Bradley K Smith
(74) *Attorney, Agent, or Firm* — Fletcher Yoder, P.C.

(57) ABSTRACT

The present technique relates to a method and apparatus to provide a dielectric etch stop layer that prevents shorts for a buried digit layer as an interconnect. In a memory device, such as DRAM or SRAM, various layers are deposited to form structures, such as PMOS gates, NMOS gates, memory cells, P+ active areas, and N+ active areas. These structures are fabricated through the use of multiple masking processes, which may cause shorts when a buried digit layer is deposited if the masking processes are misaligned. Accordingly, a dielectric etch stop layer, such as aluminum oxide $Al_2O_3$ or silicon carbide SiC, may be utilized in the array to prevent shorts between the wordlines, active areas, and the buried digit layer when the contacts are misaligned.

12 Claims, 11 Drawing Sheets

(56) References Cited

U.S. PATENT DOCUMENTS

| | | | | |
|---|---|---|---|---|
| 5,869,391 | A | 2/1999 | Manning | |
| 5,874,330 | A * | 2/1999 | Ahn | 438/230 |
| 5,909,617 | A | 6/1999 | Manning et al. | |
| 5,930,662 | A | 7/1999 | Manning | |
| 5,932,490 | A | 8/1999 | Manning | |
| 5,940,317 | A | 8/1999 | Manning | |
| 5,978,258 | A | 11/1999 | Manning | |
| 5,981,397 | A | 11/1999 | Manning | |
| 5,985,702 | A | 11/1999 | Manning | |
| 5,998,276 | A | 12/1999 | Batra et al. | |
| 6,040,221 | A | 3/2000 | Manning | |
| 6,057,198 | A | 5/2000 | Manning | |
| RE36,735 | E | 6/2000 | Manning | |
| 6,096,636 | A | 8/2000 | Manning | |
| 6,117,761 | A | 9/2000 | Manning | |
| 6,141,239 | A | 10/2000 | Manning | |
| 6,147,406 | A | 11/2000 | Manning | |
| 6,184,076 | B1 * | 2/2001 | Huang | 438/241 |
| 6,200,835 | B1 | 3/2001 | Manning | |
| 6,261,940 | B1 | 7/2001 | Manning | |
| 6,284,648 | B1 | 9/2001 | Manning | |
| 6,306,760 | B1 * | 10/2001 | Hsu et al. | 438/639 |
| 6,319,800 | B1 | 11/2001 | Manning | |
| 6,326,270 | B1 * | 12/2001 | Lee et al. | 438/279 |
| 6,362,039 | B1 | 3/2002 | Manning et al. | |
| 6,387,759 | B1 * | 5/2002 | Park et al. | 438/275 |
| 6,391,734 | B1 | 5/2002 | Rolfson et al. | |
| 6,455,918 | B2 | 9/2002 | Rolfson et al. | |
| 6,479,332 | B2 | 11/2002 | Dennison et al. | |
| 6,583,042 | B2 | 6/2003 | Manning | |
| 6,611,059 | B1 | 8/2003 | Manning | |
| 2001/0028080 | A1 * | 10/2001 | Himeno et al. | 257/315 |
| 2002/0119624 | A1 * | 8/2002 | Schuegraf et al. | 438/253 |
| 2002/0187598 | A1 | 12/2002 | Park | |
| 2003/0040171 | A1 * | 2/2003 | Weimer | 438/585 |
| 2003/0089992 | A1 * | 5/2003 | Rathi et al. | 257/762 |
| 2004/0029372 | A1 * | 2/2004 | Jang et al. | 438/586 |
| 2005/0118769 | A1 | 6/2005 | Kammler et al. | |

* cited by examiner

METHOD AND APPARATUS FOR FABRICATING A MEMORY DEVICE WITH A DIELECTRIC ETCH STOP LAYER

This application is a divisional of application Ser. No. 10/832,688, filed on Apr. 27, 2004 now U.S. Pat. No. 7,141,511.

BACKGROUND OF THE INVENTION

1. Field of the Invention

The present invention relates generally to semiconductor devices and, more particularly, to the fabrication of a buried digit line in a memory device.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, telephones, portable devices, networks, and a host of other consumer products. As is well known, microprocessors are essentially generic devices that perform specific functions under the control of a software program. This software program is stored in a memory device that is coupled to the microprocessor. Not only does the microprocessor access the memory devices to retrieve the software program instruction, but it also facilitates storage and retrieval of data created during the execution of the program in one or more of the memory devices.

It should be understood that the memory devices are typically mass produced through fabrication processes to form various structures in a semiconductor chip. In forming the structures, different materials are layered together to form signal paths or circuitry that are utilized by the memory device. These structures are connected together to facilitate the exchange signals and distribute power throughout the semiconductor chip. Additionally, the structures within the semiconductor chip may be divided into different sections, such as an array section and a peripheral section. The array section may include memory structures, such as memory cells and banks that are used to store data, while the peripheral section may include larger structures that support the array, such as drivers, decoders and/or other similar circuitry.

Regardless of the specific structures being fabricated, it is often desirable to minimize the size of the structures to allow for greater density and to reduce the contact resistance between different structures within the semiconductor chip. Generally, the critical dimensions of the structures patterned on the semiconductor chips are becoming increasingly complex as the structures are designed to operate at higher speeds. As these critical dimensions change, the electrical properties of the structures and integrated circuits vary in relation to the critical dimensions. Therefore, it is important to maintain the critical dimensions to achieve consistency in the electrical properties of the structures.

For instance, in stack capacitor dynamic random access memory (DRAM) cells, cell height may continue to increase, while the contact size is minimized. As a result, the contact resistance in the peripheral circuitry may increase, which makes high-speed designs for structures increasingly challenging. To reduce the contact resistances for the connections between the array section and the peripheral section of a memory device, a buried digit line (BDL) layer may also be utilized as a local interconnect (LI), which is a short interconnect between structures, or as a bus, which is a longer interconnect between structures. The buried digit line or local interconnect (BDL/LI) layer may have connections to different structures, such as dynamic random access memory (DRAM) cells, p-type metal oxide semiconductor (PMOS) gates, n-type metal oxide semiconductor (NMOS) gates, P+ active areas and N+ active areas, which are formed in the peripheral and array sections of the semiconductor chip.

In fabricating the BDL/LI layer, two to three masking layers are generally utilized in the fabrication process to provide access from the BDL/LI layer to different areas of the device. These additional masking layers consume valuable fabrication time and increase the cost of manufacturing the semiconductor chip. Accordingly, minimizing the masking layers and corresponding deposition/etch steps may enhance the fabrication process of the semiconductor chip.

BRIEF DESCRIPTION OF THE DRAWINGS

The foregoing and other advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present technique is an improved approach for fabricating a buried digit line, wordlines, or bitlines, which may also be used as a local interconnect or a bus. In accordance with the present technique, a dielectric etch stop layer may be utilized to enable access between the peripheral and array sections of a memory device. The dielectric etch stop layer may provide protection from over etching and misaligned pattern etching that may cause shorts within the memory device, thereby increasing processing yield. In addition, the dielectric etch stop layer may reduce the masking steps that are utilized to form the BDL/LI layer within the memory device, which may reduce the processing time and cost of fabricating the memory device.

Figure 1:
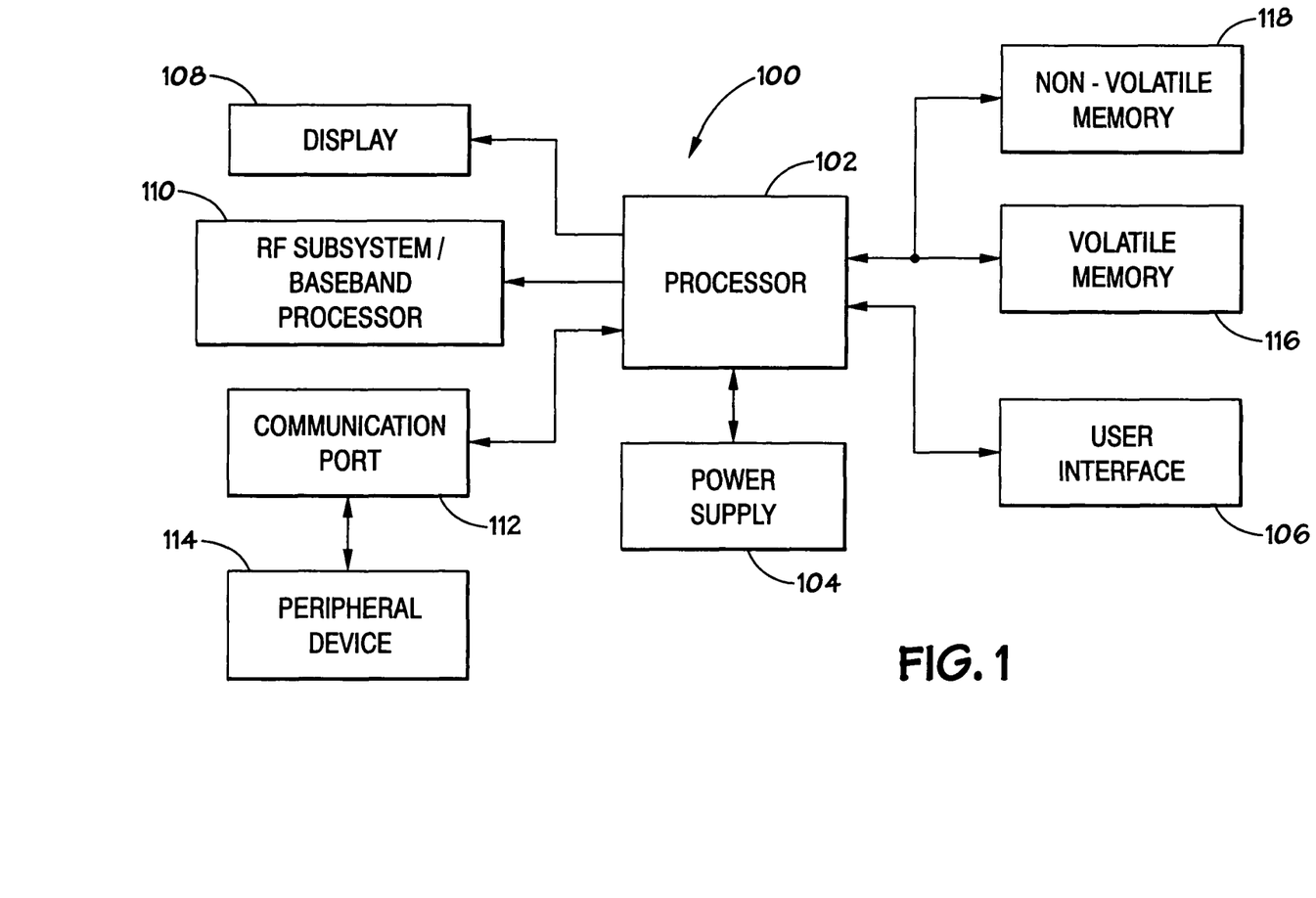
FIG. 1 illustrates a block diagram of an exemplary processor-based device that incorporates the present technique.

Turning now to the drawings, and referring initially to FIG. 1, a block diagram depicting an exemplary processor-based device, generally designated by the reference numeral 100, is illustrated. The device 100 may be any of a variety of different types, such as a computer, pager, cellular telephone, personal organizer, control circuit, etc. In a typical processor-based device, a processor 102, such as a microprocessor, controls many of the functions of the device 100.

The device 100 typically includes a power supply 104. For instance, if the device 100 is portable, the power supply 104 may include permanent batteries, replaceable batteries, and/or rechargeable batteries. The power supply 104 may also include an A/C adapter, so that the device may be plugged into a wall outlet, for instance. In addition, the power supply 104 may include a D/C adapter, so that the device 100 may be plugged into a vehicle's cigarette lighter.

Various other components may also be coupled to the processor 102, which may depend on the function's that the device 100 performs. For instance, a user interface 106 may be coupled to the processor 102 to allow a user to enter data into the device 100. The user interface 106 may include buttons, switches, a keyboard, a light pen, a mouse, and/or a voice recognition system. A display 108 may also be coupled to the processor 102 to present the user with information. The display 108 may include a liquid crystal display (LCD), a cathode ray tube (CRT), light emitting devices (LEDs), and/or an audio display. Furthermore, a radio frequency (RF) subsystem/baseband processor 110 may also be coupled to the processor 102 to communicate with other devices through a wireless link. The RF subsystem/baseband processor 110 may include an antenna that is coupled to an RF receiver and to an RF transmitter (not shown). Also, a communication port 112 may be coupled to the processor 102 to communicate with other devices through a physical link. The communication port 112 may be adapted to be coupled to a peripheral device 114, such as a modem, a printer, or a computer, for instance.

Because the processor 102 controls the functioning of the device 100, which is generally under the control of software programming, memory is coupled to the processor 102 to store and facilitate execution of the software programs. For instance, the processor 102 may be coupled to a memory device 116 that may be volatile memory, which may include dynamic random access memory (DRAM) and/or static random access memory (SRAM), for instance. The amount of DRAM and SRAM may depend on the specific design of the device 100. The processor 102 may also be coupled to a memory device 118 that is non-volatile memory. The memory device that is non-volatile memory 118 may include read only memory (ROM), such as an erasable programmable ROM (EPROM), to be used in conjunction with the memory device 116. The size of the ROM is typically selected to be just large enough to store any necessary operating system, application programs, and fixed data. The memory device 116 that is volatile memory, on the other hand, is typically quite large so that it can store dynamically loaded applications. Additionally, the memory device 118 that is non-volatile memory may include a high capacity memory, such as a disk or tape drive memory.

The processor-based device 100 may include numerous semiconductor chips in the various components that are utilized to provide the functionality to the device 100. For instance, the memory device 116 that is volatile memory and the memory device 118 that is non-volatile memory may be semiconductor chips that are coupled to the processor 102 to store the software programming for the operation of the processor-based device 100. The semiconductor chips may exchange signals with each other and with other components of the device 100 to perform their respective functions. As such, improvements in each of the semiconductor chips may improve the efficiency of the processor-based device 100 and provide reliable access to the information stored in the memory devices 116 and 118.

Figure 2:
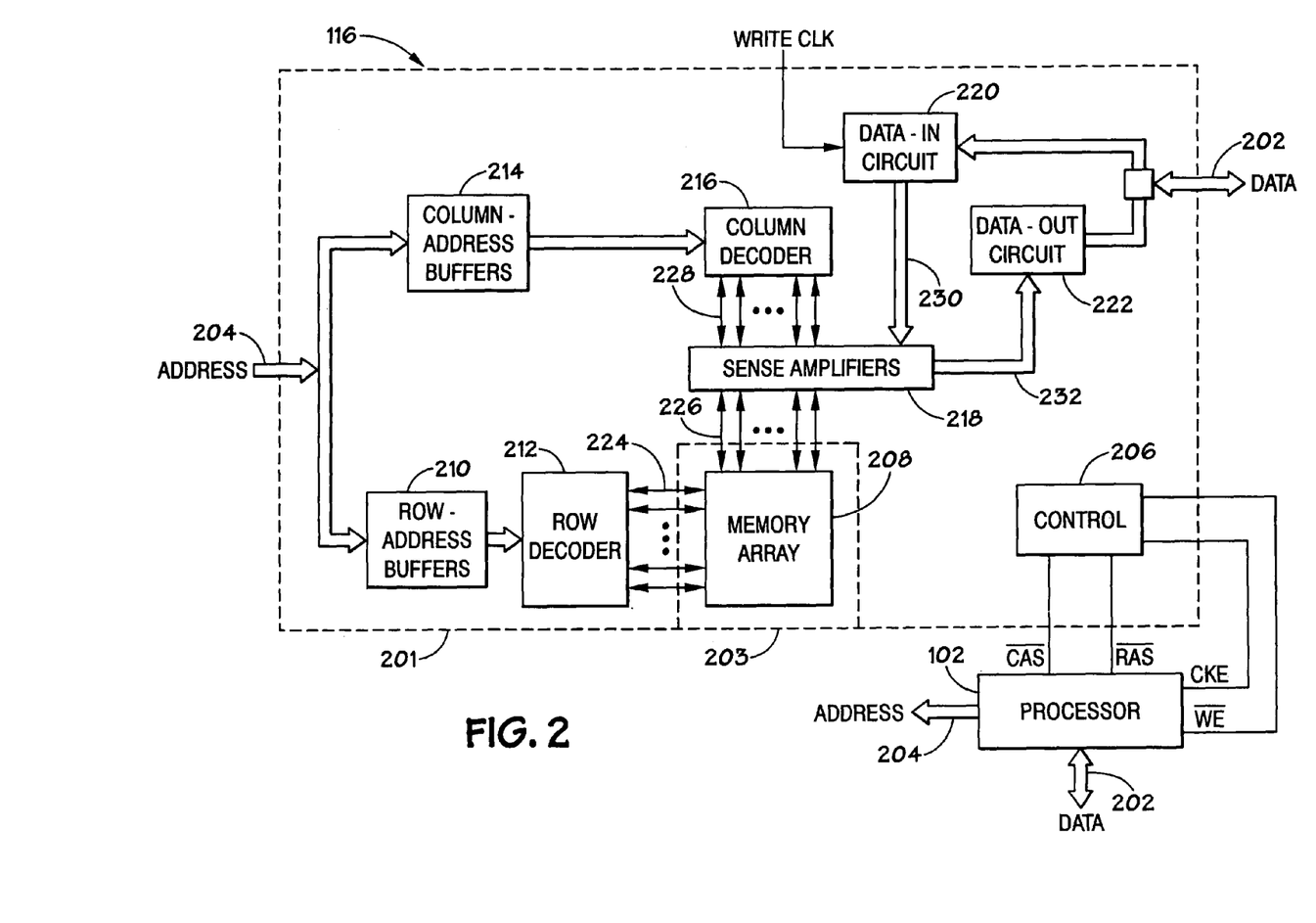
FIG. 2 illustrates a block diagram depicting an exemplary embodiment of a memory device utilized in the processor-based device of FIG. 1.

Turning now to FIG. 2, a block diagram depicting an exemplary embodiment of a memory device is illustrated. The description of the memory device 116, which may be the volatile memory device 116 of FIG. 1, has been simplified for illustrative purposes and is not intended to be a complete description of all features in a memory device 116. Likewise, the present technique may not be limited to a memory device 116 being a specific memory type, such as SRAMs or DRAMs, but may be applicable to other devices, such as memory buses, processors, network processors, application specific integrated circuits (ASICs), and intra-chip buses, which may benefit from a local interconnect between different regions of a semiconductor chip. As such, various devices may implement the present technique.

The memory device 116 may include a peripheral portion 201 and an array portion 203. The peripheral portion 201 may include various circuitry that supports the array portion 203, such as row-address buffers 210, row decoder 212, column-address buffers 214, column decoder 216, sense amplifiers 218, data-in circuitry 220, data out circuitry 222, and/or other similar circuitry. The array section 203 may include memory structures, such as a memory array 208 that includes memory banks and cells that are used to store data.

During operation, the memory device 116 may receive various inputs that are utilized by various circuits within the memory device 116. For instance, individual inputs, such as control information, address information, and data, may be provided over a memory bus to the memory device 116. These individual representations of inputs are illustrated by a data bus or lines 202, address lines 204, and various discrete lines directed to control logic 206. The memory device 116 includes a memory array 208, which comprises rows and columns of addressable memory cells. To provide access to the memory cells, each memory cell in a row is coupled to a wordline via one of the interconnects 224, for instance. Additionally, each memory cell in a column is coupled to a bit line via one of the interconnects 226, for instance. The wordline and bit line may be utilized to access a storage capacitor through an access transistor in the memory array 208, as can be appreciated.

The memory device 116 interfaces with, for example, a processor 102, such as a microprocessor, through address lines 204 and data lines 202. Alternatively, the memory device 116 may interface with other devices, such as a memory controller, a microcontroller, a chip set, or another electronic system. The processor 102 may also provide a number of control signals to the memory device 116. Such control signals may include row and column address strobe signals RAS and CAS, a write enable signal WE, a clock enable signal CKE, and other conventional control signals. The control logic 206 controls many available functions of the memory device 116. In addition, various other control circuits and signals not detailed herein contribute to the operation of the memory device 116.

Row-address buffers 210 and a row decoder 212 receive and decode row addresses from row address signals provided on the address lines 204. Each unique row address corresponds to a row of cells in the memory array 208. The row-address decoder 210 may also determine when a row is defective, as well as the address of a replacement row. The row decoder 212 typically includes a wordline driver, an address decoder tree, and circuitry which translates a given row address received from the row-address buffers 210 and selectively activates the appropriate wordline of the memory array 208 via the wordline drivers.

A column address buffer 214 and a column decoder 216 receive and decode column address signals provided on the address lines 204. The column decoder 216 may also determine when a column is defective, as well as the address of a replacement column. The column decoder 216 is coupled to sense amplifiers 218 via interconnects 228. The sense amplifiers 218 are coupled to complimentary pairs of bit lines of the memory array 208, for example.

The sense amplifiers 218 are coupled to data-in (i.e., write) circuitry 220 via interconnections 230 and data-out (i.e., read) circuitry 222 via interconnections 232. The data-in circuitry 220 and the data-out circuitry 222 include data drivers and latches. During a write operation, the data bus 202 provides data to the data-in circuitry 220. The sense amplifier 218 receives data from the data-in circuitry 220 and stores the data in the memory array 208 as a charge on a capacitor of a cell at an address specified on the address lines 204.

During a read operation, the memory device 116 transfers data from the memory array 208 to the processor 102. Complimentary bit lines for the accessed cell are equilibrated during a precharge operation to a reference voltage provided by an equilibration circuit and a reference voltage supply. The charge stored in the accessed cell is then shared with the associated bit line. The sense amplifier 218 detects and amplifies a difference in voltage between the memory bit's bitline and the reference bitline. Address information received on address lines 204 is used to select a subset of the bit lines and provides them to the interconnects 232, which may be local interconnects or buses, such as input/output (I/O) wires or lines. The amplified voltage signals are delivered to the data-out circuitry 222 via interconnects 232 and eventually delivered to the data bus 202. The data-out circuitry 222 may include a data driver (not shown) to drive data out onto the data bus 202 in response to a read request directed to the memory array 208. Further, the data-out circuitry 222 may include a data latch (not shown) to latch the read data until it is driven onto the data bus 202 by the data driver.

During operation of the memory device 116, signals may be exchanged between the peripheral portion 201 and the array portion 203, within the components in the peripheral portion 201 and/or array portion 203, or between the components in the peripheral portion 201 and/or array portion 203. For instance, if the array portion 203 includes the memory array 208, interconnects 224 and 226 may provide access between the array and peripheral portions 201 and 203. However, if the array portion 203 includes the memory array 208 and the sense amplifiers 218, then interconnects 224, 228, 230 and 232 may provide access between the array and peripheral portions 201 and 203. Specifically, the interconnects 224-232 may provide access between memory cells, such as DRAM or SRAM cells in the memory array 208, and PMOS gates, NMOS gates, P+ active areas and N+ active areas, which may be in the peripheral portion 201 or the array portion 203.

In fabricating these interconnects 224-232, which may be referred to as buried digit lines, wordlines, or bitlines, different fabrication processes and steps may be utilized to form the interconnection between the various structures, which may be buses and/or local interconnects. Accordingly, it may be advantageous to reduce the number of masking layers utilized to form the interconnects 224-232. For instance, the memory device 116 may be designed to include a dielectric etch stop layer, such as an aluminum oxide ($Al_2O_3$) material, a silicon carbide (SiC) material, or other suitable material, over the peripheral portion 201 and the array portion 203 of the memory device 116, as described further below. By utilizing the dielectric etch stop layer, the interconnects 224-232 may be fabricated with fewer masking layers, while providing reduced resistances for high speed designs. The use of the dielectric etch stop layer may be included with current fabrication steps with modifications to the etching processes utilized.

In addition, the dielectric etch stop layer may protect the peripheral portion 201 and the array portion 203 of the memory device 16 from inadvertent shorts. The dielectric etch stop layer may prevent any misaligned formations from causing shorts. With the reduction in the dimensions of the structures and the increase in cell height, the dielectric etch stop layer provides an extra dielectric material that maintains the electrical properties of the structures, such as wordlines, buried digit lines, local interconnects, and/or active areas. Accordingly, the memory device 116 may be fabricated with fewer process steps, which may reduce the cost of fabricating the memory device 116 and improve yield. The exemplary techniques for fabricating a buried digit line, wordlines, bitlines, or local interconnects, such as one or more of the interconnects 224-232, for example, is explained in greater detail with FIGS. 3-19.

FIGS. 3-19 illustrate exemplary techniques for fabricating a buried digit line, wordlines, bitlines, or local interconnects within the memory device of FIG. 2. The exemplary techniques described with reference to FIGS. 3-19 implement a dielectric etch stop layer that may be deposited after spacer formation. This dielectric etch stop layer may be deposited over a peripheral portion 201 and an array portion 203 of the memory device 116 during fabrication, for instance. Accordingly, the dielectric etch stop layer may reduce shorts within the memory device 116 from coupling the interconnects 224-232 or local interconnects to the various components, which may provide access to wordlines, gates, and active areas in the peripheral and array portions 201 and 203 of the memory device 116. As will be evident from the description below, the various alternatives to the process described with respect to the FIGS. 3-19 may be implemented.

Figure 3:
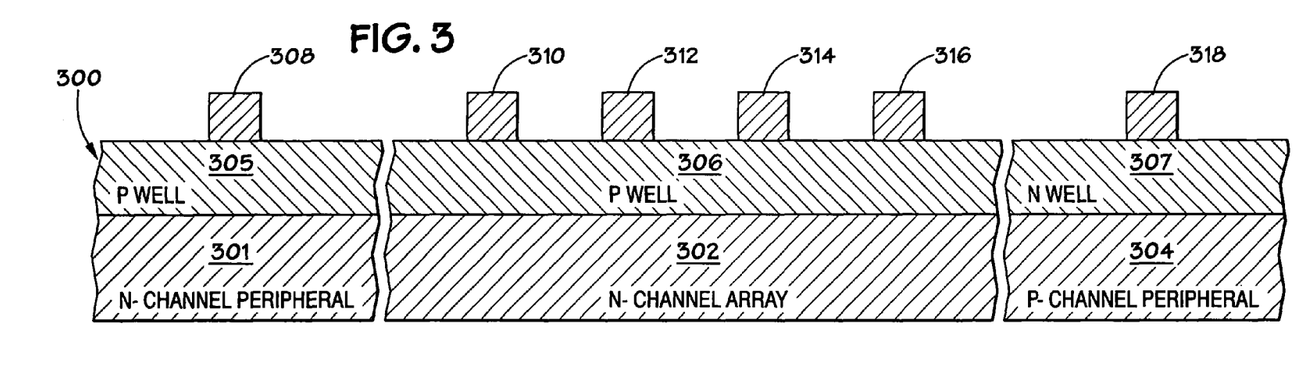
FIGS. 3-19 illustrate cross-sectional views of portions of the memory device of FIG. 2 during different stages of fabrication.

Turning now to the first exemplary process for fabricating a buried digit line, wordlines, or bitlines, which may be utilized as a local interconnect in accordance with the present techniques, FIG. 3 illustrates a cross-sectional view of a portion of a memory device 116 of FIG. 2 to illustrate an exemplary method of fabricating the BDL/LI layer. In one exemplary embodiment, a substrate 300 may include different portions of a silicon wafer implemented to fabricate the memory device 116. The substrate 300 may be divided into a first peripheral section 301, an array section 302, and a second peripheral section 304. The first peripheral section 301 may be an N channel peripheral section of the substrate 300 with a P well 305, while the array section 302 may be an N channel array section of the substrate 300 with a P well 306. The second peripheral section 304 may be a P channel peripheral section of the substrate 300 with an N well 307. The sections 301-304 may also include a number of layers disposed thereon such that the processing described herein occurs over any number of layers already deposited on the wafer, as can be appreciated by those skilled in the art.

Deposited over the sections 301-304, a NMOS gate 308, wordlines 310-316, and a PMOS gate 318 may be formed, which may be a portion of interconnects 224-232 of FIG. 2. The NMOS gate 308, wordlines 310-316, and the PMOS gate 318 may comprise a plurality of layers, which form a wordline stack. For instance, the wordline stack may include a doped semiconductor layer, such as a polysilicon layer, a first conductive layer, such as a tungsten nitride ($WN_x$) layer, a second conductive layer, such as a tungsten (W) layer, and a cap layer, such as a silicon nitride layer. Each of the NMOS gate 308, wordlines 310-316, and the PMOS gate 318 may be formed on a gate oxide layer that is a portion of the substrate 300 or formed over the substrate and below the NMOS gate 308, wordlines 310-316, and the PMOS gate 318. Further, between each of the NMOS gate 308, wordlines 310-316, and the PMOS gate 318 various insulating materials, such as oxides, silicon nitride, or other such dielectric materials may be deposited. In addition, a doped region may be formed between the wordlines 310-316 in or over the sections 301-304. The NMOS gate 308, wordlines 310-316, and the PMOS gate 318 may be formed through chemical vapor deposition, physical vapor deposition, or other similar processes that form a thin film of material on the surface of a substrate 300 or structures. The techniques for forming the w NMOS gate 308, wordlines 310-316, and the PMOS gate 318 and related structures will be appreciated by those skilled in the art.

Figure 4:
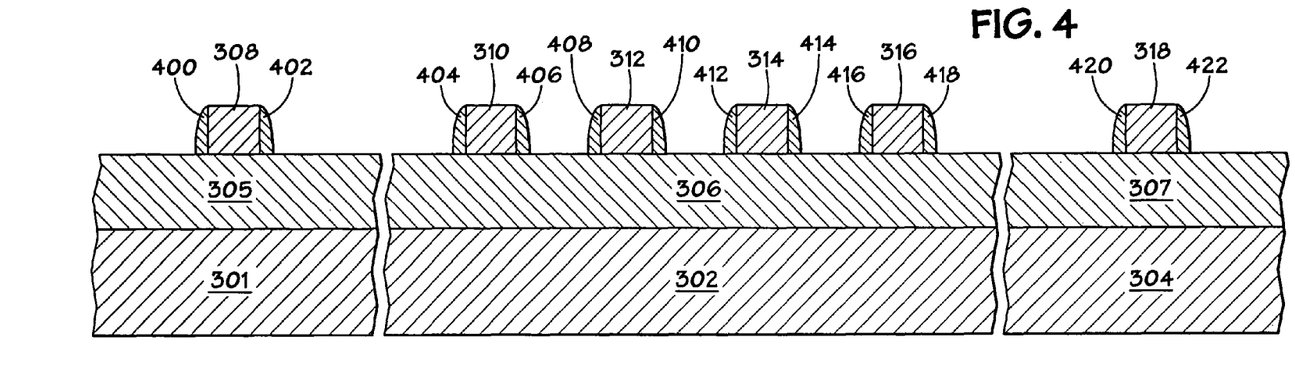

As shown in FIG. 4, spacers 400-422 may be formed adjacent to the NMOS gate 308, wordlines 310-316, and the PMOS gate 318. The spacers 400-422 may be formed by depositing a dielectric layer and etching the dielectric layer from a portion of the sections 301-304 and a portion of the NMOS gate 308, wordlines 310-316, and the PMOS gate 318. The spacers 400-422 may be utilized to provide insulation from neighboring regions, to protect the NMOS gate 308, wordlines 310-316, and the PMOS gate 318 from damage during the various fabrication steps and to provide implant boundaries for defining transistor characteristics. The spacers 400-422 may be formed from a dielectric material, such as an oxide or nitride material, or other suitable material that may provide sidewall insulation for the NMOS gate 308, wordlines 310-316, and the PMOS gate 318. Further, the spacers 400-422 may be designed to a specific thickness to provide self-aligned contacts in later fabrication steps, as discussed below. The technique for forming the spacers 400-422 will be appreciated by those skilled in the art.

Figure 5:
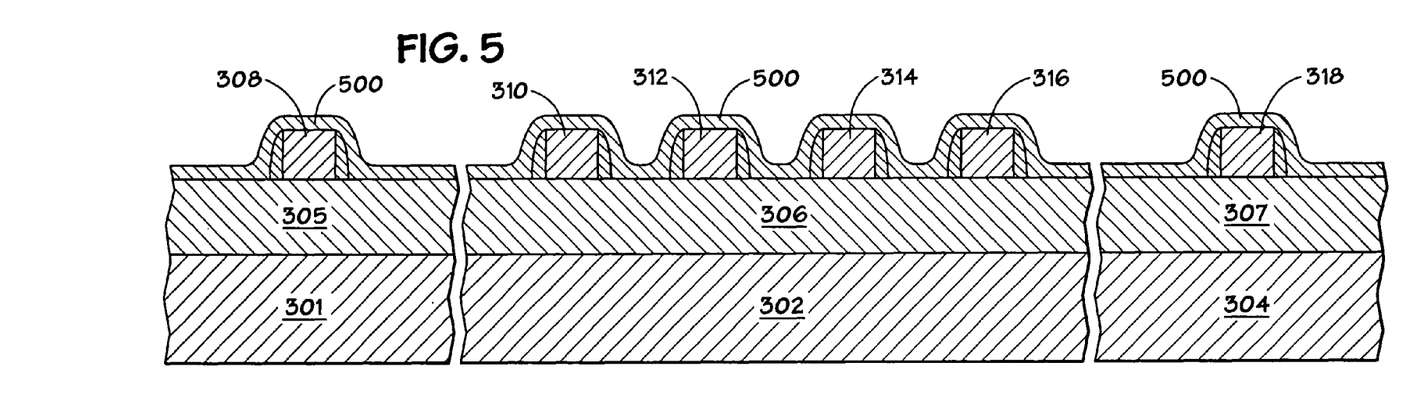

After spacer formation, a dielectric etch stop layer 500 may be deposited over the sections 301-304, including the wordlines 308-318 and spacers 400-422, as shown in FIG. 5. The dielectric etch stop layer 500 may be selected to prevent the etching or removal of an underlying nitride or oxide material. Generally, selectivity refers to the relative etch rate of different materials. For instance, the selectivity may relate to the etching of the overlying material at a faster rate than the underlying material. The selectivity is generally expressed as a ratio of the etch rate of the underlying material verses the etch rate of the overlying material. Because the dielectric etch stop layer 500 is chosen to prevent the etching of the spacers 400-422 and/or the nitride layer of the NMOS gate 308, wordlines 310-316, and the PMOS gate 318, the dielectric etch stop layer 500 may be a material that may stop or slow the etching of a material over the dielectric etch stop layer 500 to prevent damage or over etching. Accordingly, the dielectric etch stop layer 500 may be an aluminum oxide $Al_2O_3$, a silicon carbide SiC, hafnium oxide $HfO_2$, hafnium aluminum oxide HfAlO, silicon carbon nitride SiCN, silicon nitride $Si_3N_4$, silicon oxide $SiO_2$, yttrium oxide $YO_2$, or tantalum pentoxide $Ta_2O_5$. The use of the dielectric etch stop layer 500 will be discussed further with reference to FIGS. 11-19.

Figure 6:
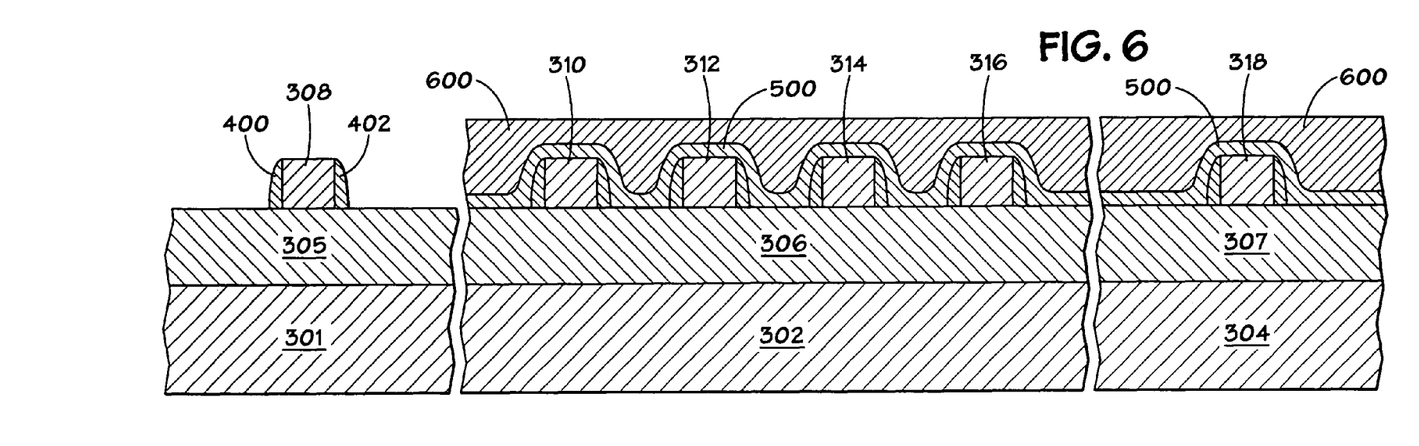

Referring now to FIG. 6, a photoresist 600 may be deposited over the sections 301-304, the NMOS gate 308, wordlines 310-316, the PMOS gate 318, and spacers 400-422, and subsequently developed to expose portions of the dielectric etch stop layer 500, which may also be etched to expose the first peripheral section 301, the NMOS gate 308, and the spacers 400 and 402. The photoresist 600 may utilize photolithographic processes to form the structure illustrated in FIG. 6. The photoresist 600 may be a light sensitive material that changes its properties when exposed to light. For instance, photoresist may be a liquid chemical that is spun or rolled onto the sections 301-304. The photoresist 600 may be developed by exposure to an ultraviolet light or light of a specific frequency, which is utilized to form a pattern in the photoresist 600. To develop the photoresist 600, an etchant may be utilized to remove selected portions of the photoresist 600 according to the exposed pattern to form a desired pattern in the photoresist 600. Then, another etchant, which may be part of a dry and/or wet etching process, may be utilized to remove the exposed portions of the dielectric etch stop layer 500. In the present embodiment, the etchant used in the etching process may remove the dielectric etch stop layer 500 to expose the first peripheral section 301, the NMOS gate 308 and the spacers 400 and 402, as illustrated in FIG. 6. It should be understood that those in the art readily understand the deposition, development, and etching techniques used to construct the pattern in the photoresist 600.

Figure 7:
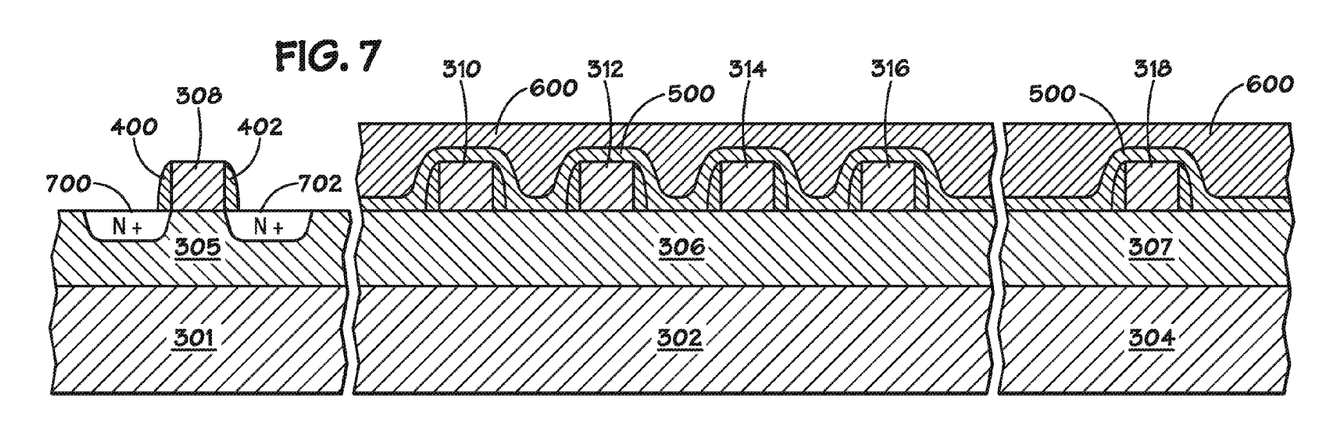

Once the pattern is etched into the photoresist 600, the first peripheral section 301, the NMOS gate 308 and spacers 400 and 402 are exposed for other processing, such as N+ doping. As shown in FIG. 7, the active areas or doped regions 700 and 702 may be formed adjacent to the NMOS gate 308 through conventional techniques. These techniques may include diffusion, ion implantation, or other similar process for introducing dopants into the first peripheral section 301. Dopants are generally selected from group V on the periodic chart, which may include Phosphorus (P), Antimony (Sb), and/or Arsenic (As), for example. As a result of the doping process, the N+ doped regions 700 and 702 may be formed in the N channel silicon of the first peripheral section 301.

Figure 8:
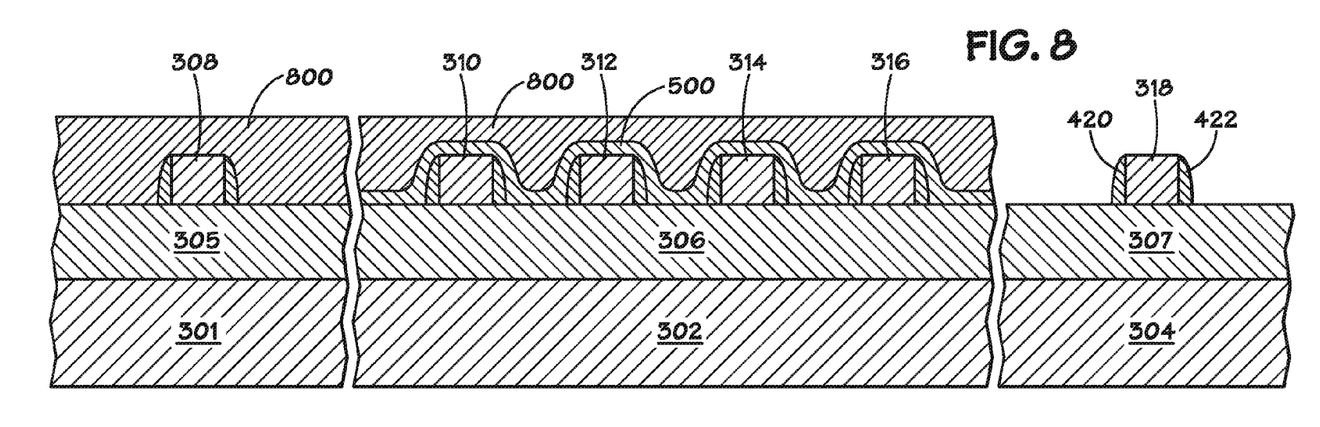

Next, the photoresist 600 may be removed by a wet etch and/or a dry strip process, such as a chemical rinse, for example, and another photoresist 800 may be deposited over the sections 301-304 including the NMOS gate 308, wordlines 310-316, the PMOS gate 318 and spacers 400-422, and subsequently developed to expose portions of the dielectric etch stop layer 500, which may be etched to expose the second peripheral section 304 for another doping process. As shown in FIG. 8, a photoresist 800 may be applied to the second peripheral section 304 to form a pattern in the photoresist 800. The photoresist 800 may be developed to expose portions of the dielectric etch stop layer 500 for another etching process to expose the second peripheral section 304, the PMOS gate 318, and the spacers 420 and 422. As noted above with regard to the description of FIG. 6, it should be understood that those in the art readily understand the deposition, development, and etching techniques used to construct the pattern in the photoresist 800.

Figure 9:
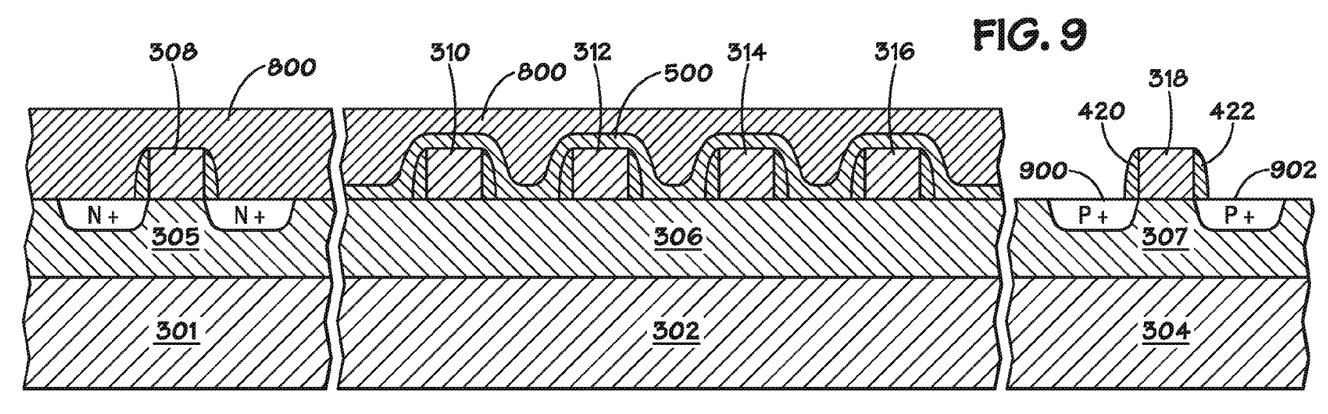

Once the pattern is etched into the photoresist 800, the second peripheral section 304, the PMOS gate 318 and spacers 420 and 422 may be exposed to a P+ doping process, as shown in FIG. 9. Similar to the discussion above with reference to FIG. 7, the P+ doping process may form active areas or doped regions 900 and 902. The P+ dopants may include Boron (B), Aluminum (Al), Indium (In) or Gallium (Ga), for example. Through the use of these P+ dopants, the P+ doped regions 900 and 902 may be formed in the second peripheral section 304 adjacent to the PMOS gate 318.

Figure 10:
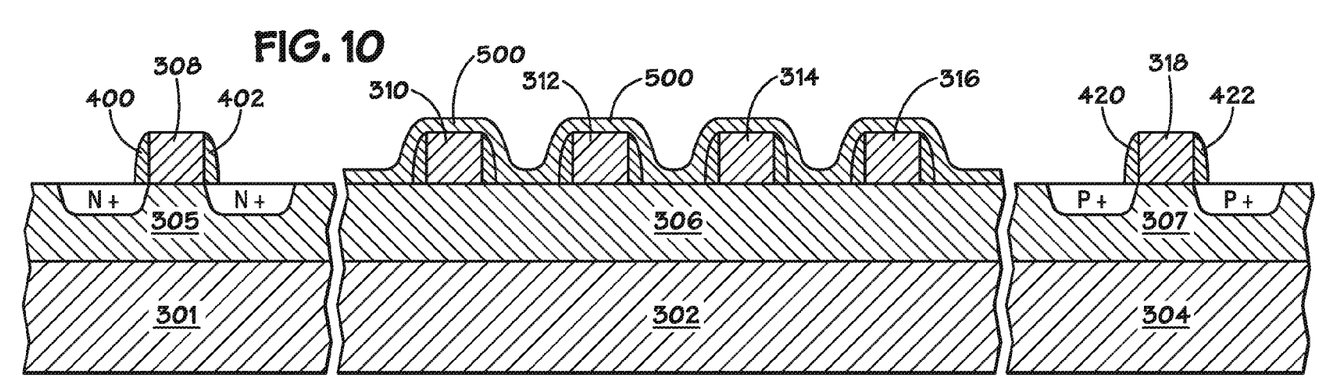

After the doped regions 900 and 902 are formed, the photoresist 800 may be removed, as shown in FIG. 10. In FIG. 10, an etchant that is selective to the photoresist 800 relative to the dielectric etch stop layer 500 may be utilized to remove the photoresist 800 from the sections 301-304, the NMOS gate 308, wordlines 310-316, the PMOS gate 318, spacers 400-

422 and the dielectric etch stop layer 500. The etchant may remove the photoresist 800, but leaves the dielectric etch stop layer 500 over the array section 302, wordlines 310-316, and the spacers 404-418.

Figure 11:
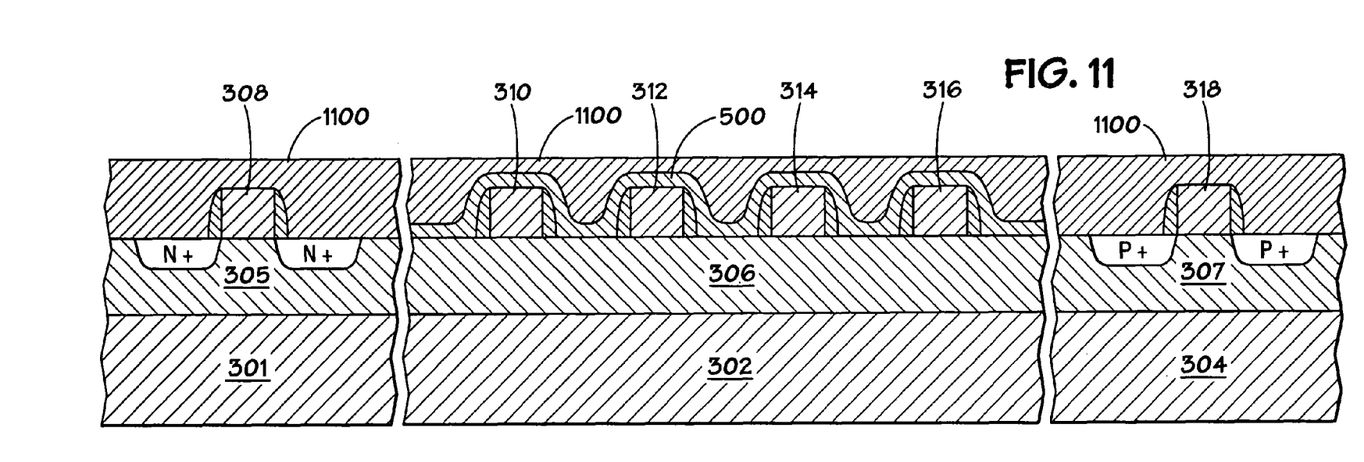

In FIG. 11, a first dielectric layer 1100 may be deposited and patterned over the sections 301-304, the NMOS gate 308, wordlines 310-316, the PMOS gate 318, spacers 400-422, and the dielectric etch stop layer 500 using conventional techniques. These conventional techniques may include chemical vapor deposition, physical vapor deposition, sputtering, atomic layer deposition, or any other suitable deposition process. The first dielectric layer 1100 may include material, such as an oxide, a nitride, a glass, such as Boro-Phospho-Silicate Glass (BPSG), or any other suitable material having dielectric properties. However, the first dielectric layer 1100 is different from the dielectric etch stop layer 500 to allow selective etching in relation to the dielectric etch stop layer 500. Additionally, in some instances, the dielectric layer 1100 may be planarized over the sections 301-304, the NMOS gate 308, wordlines 310-316, the PMOS gate 318, spacers 400-422, and the dielectric etch stop layer 500 using conventional techniques. If the first dielectric layer 1100 is planarized, the NMOS gate 308, wordlines 310-316, the PMOS gate 318 or the dielectric etch stop layer 500 over the NMOS gate 308, wordlines 310-316, and the PMOS gate 318 may be exposed.

Figure 12:
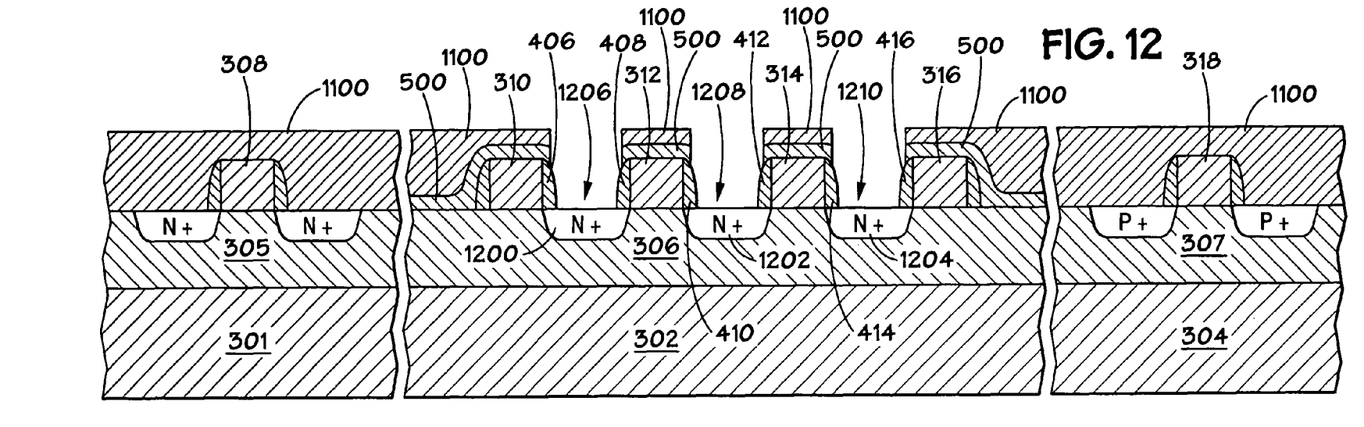

As shown in FIG. 12, the dielectric etch stop layer 500 and the first dielectric layer 1100 may be patterned and etched between the wordlines 310-316 to provide access to the array section 302, which may include active areas or doped regions 1200-1204 in the array section 302. The etching of the dielectric etch stop layer 500 and the dielectric layer 1100 may expose the array section 302 through openings 1206-1210 that are between the wordlines 310-316. The openings 1206-1210 may be utilized to provide self-aligned contact formations that provide access to the array section 302. For instance, a doping process, such as a N+ doping process, may be utilized to dope the regions 1200-1204. It should be noted that the doped regions 1200-1204 may be doped before and/or after the dielectric etch stop layer 500 is removed.

Figure 13:
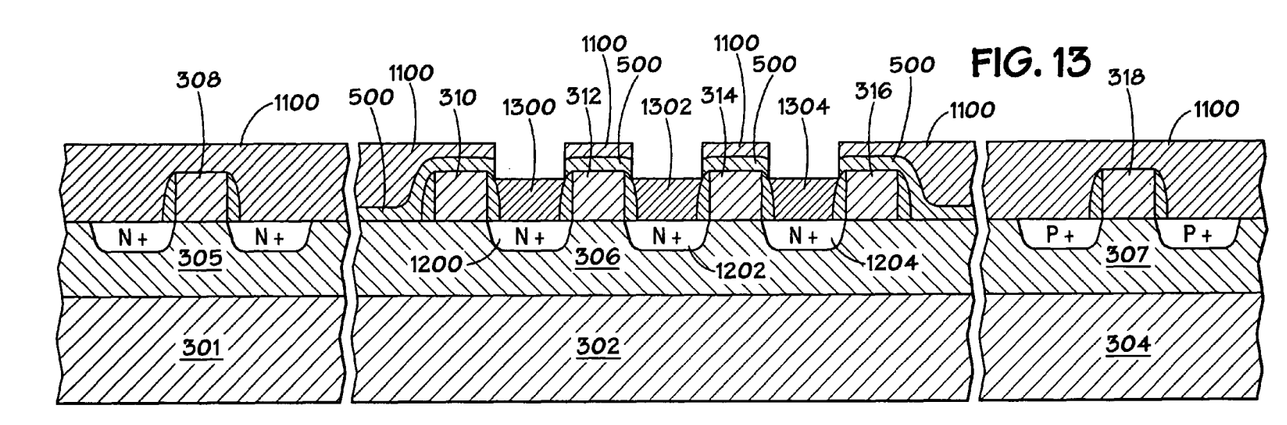

In FIG. 13, conductive plugs 1300-1304 may be deposited within the openings 1206-1210. The conductive plugs 1300-1304 may comprise an amorphous, partially, or totally poly crystalline form of silicon, N-doped or P-doped polysilicon, titanium (Ti), titanium nitride (TiN), tungsten (W), an epitaxially grown silicon, or any other suitable conductive material. The conductive plugs 1300-1304 may be created from a chemical vapor deposition process that utilizes a silicon gas, such as silane ($SiH_4$). The conductive plugs 1300-1304 may be deposited over the array section 302 and between the spacers 406-408, 410-412, and 414-416.

Figure 14:
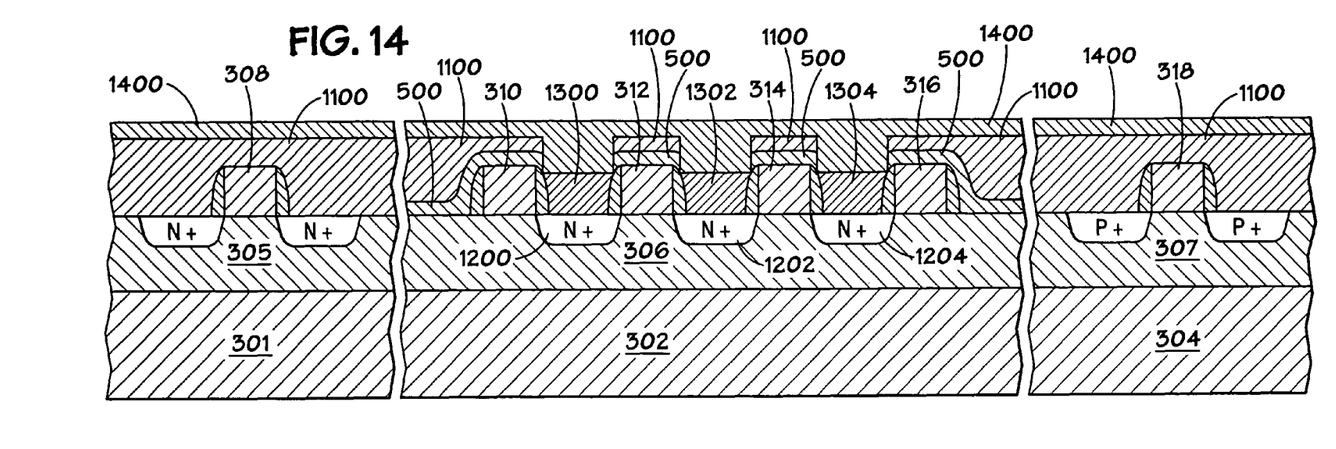

In FIG. 14, a second dielectric layer 1400 may be deposited and patterned over the sections 301-304, the NMOS gate 308, wordlines 310-316, the PMOS gate 318, spacers 400-422, the dielectric etch stop layer 500, first dielectric layer 1100 and conductive plugs 1300-1304 using conventional techniques. These conventional techniques may include chemical vapor deposition, physical vapor deposition, sputtering, atomic layer deposition, or other suitable deposition process. The second dielectric layer 1400 may include a material, such as a tetraethyl-orthosilicate (TEOS), a nitride material, or any other dielectric material. However, the second dielectric layer 1400 is different from the dielectric etch stop layer 500 to allow selective etching in relation to the dielectric etch stop layer 500. In some instances, the second dielectric layer 1400 may be applied directly over the NMOS gate 308, wordlines 310-316, the PMOS gate 318 or the dielectric etch stop layer 500.

Figure 15:
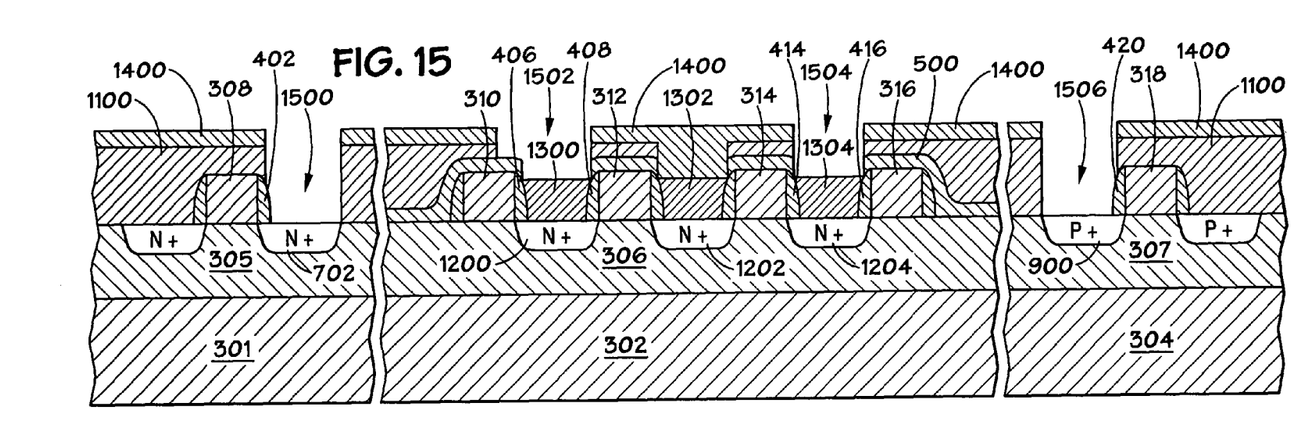

As shown in FIG. 15, an etchant may be utilized to create various openings 1500-1506 within the first dielectric layer 1100 and the second dielectric layer 1400. To form the openings 1500-1506, a dry etching and/or wet etching process may be utilized. The process may use an etchant that may penetrate the first dielectric layer 1100 and the second dielectric layer 1400. The openings 1500-1506 may expose various regions of the substrate 300, such as doped regions 702 and 900 and the conductive plugs 1300 and 1304. Specifically, the opening 1500 exposes the doped region 702, which is an N+ active area on the first peripheral section 301, while the opening 1506 exposes the doped region 900, which is a P+ active area in the second peripheral section 304. The openings 1502 and 1504 may provide access to the conductive plugs 1300 and 1304.

In forming the openings 1500-1506, the exposure of the wordline 310-316 may create shorts or otherwise damage the memory device 116. For example, in etching the opening 1502, the etching pattern may be misaligned and expose a portion of the wordline 310. However, the etchant may be selective to the first dielectric layer 1100 and the second dielectric layer 1400 relative to the dielectric etch stop layer 500. As a result, the wordline 310 may remain protected by the dielectric etch stop layer 500 to prevent inadvertent exposure by the etching process. Beneficially, the dielectric etch stop layer 500 may prevent the etching process that formed the openings 1500-1506 from exposing the wordlines 310-316, which may cause shorts in later processes.

In addition, the dielectric etch stop layer 500 may prevent the etching process that formed the openings 1500-1506 from exposing the wordlines 310-316, because the etching of the openings 1500 and 1506 may require a longer etching period to reach the doped regions 702 or 900. The openings 1500 and 1506 may extend to the doped regions 702 and 900, which are a portion of or formed on the sections 301 and 304. However, the openings 1502 and 1504 may be to the conductive plugs 1300 and 1304, which are formed above the array section 302. With the etchant being selective to the first dielectric layer 1100 and the second dielectric layer 1400 relative to the dielectric etch stop layer 500, the dielectric etch stop layer 500 may prevent over etching in the areas adjacent to the conductive plugs 1300 and 1304. As a result, the wordlines 310-316 may remain protected by the dielectric etch stop layer 500 to prevent inadvertent exposure from over etching.

Figure 16:
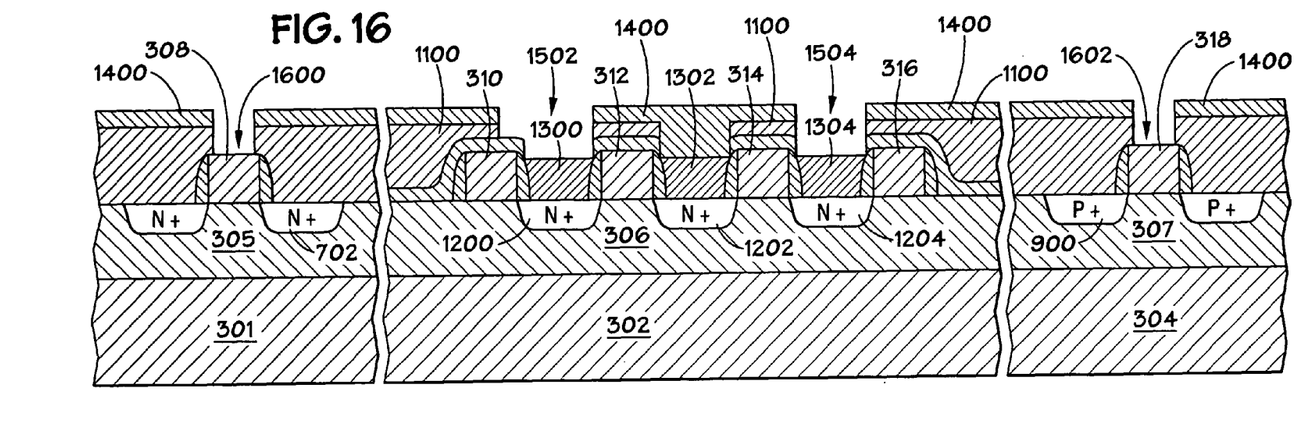

Alternatively, as shown in FIG. 16, openings 1502, 1504, 1600 and 1602 may also be created within the first dielectric layer 1100 and the second dielectric layer 1400. The openings 1502, 1504, 1600 and 1602 may expose various regions of the substrate 300, such as the NMOS gate 308, the PMOS gate 318, and the wordlines 310 and 314. As discussed above, the openings 1502 and 1504 exposes the conductive plugs 1300 and 1304 that are part of the section 302. The openings 1600 and 1602 may provide access to the NMOS gate 308 and PMOS gate 318, respectively. Similar to the discussion above, the etch pattern may be misaligned and etch into the first dielectric layer 1100 or the second dielectric layer 1400 adjacent to the wordlines 310-316. As such, the dielectric etch stop layer 500 may protect portions of the array section 302 or the wordlines 310-316 from being exposed by the etching process that creates the openings 1600 and 1602.

Figure 17:
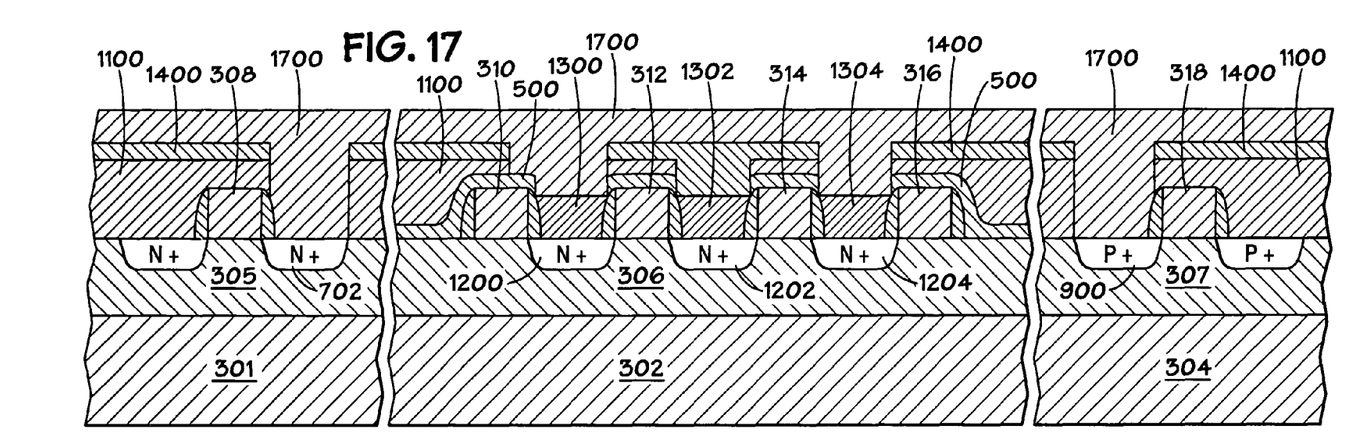

In FIG. 17, a buried digit line or local interconnect (BDL/LI) layer 1700 may be deposited in the openings 1500-1506 and over the second dielectric layer 1400. The BDL/LI layer 1700 may provide access to the doped regions 1200-1204 between the wordlines 310 and 316 and/or to the conductive plugs 1300 and 1304 of the array section 302 and the doped regions 702 and 900 of the peripheral sections 301 and 304. This interconnection provides access between memory cells formed on the array section 302 along with active areas and gates on the peripheral sections 301 and 304. The BDL/LI layer 1700 may include a conductive material, such as polysilicon, tungsten (W), copper (Cu), or other similar conductive materials. Further, the BDL/LI layer 1700 may be selected to provide ohmic connection to various materials, such as the conductive plugs 1300 and 1304, doped regions 702 and 900, and/or the NMOS gate 308 and the PMOS gate 318, respectively.

Advantageously, because the BDL/LI layer 1700 may be deposited in openings 1500-1506 and 1600-1602 that are not properly aligned, the dielectric etch stop layer 500 may protect areas that are inadvertently exposed during the etching processes. In addition, because the etching of the openings 1500-1506 and 1600-1602 may vary in the depth in some of the regions, the dielectric etch stop layer 500 may prevent the etchant from exposing other regions, which may again cause shorts. Accordingly, the dielectric etch stop layer 500 may prevent shorts between the BDL/LI layer 1700, the wordlines 310-316, and the conductive plugs 1300-1304. The dielectric etch stop layer 500 may be formed with the addition of a dielectric etch stop deposition process, and two dielectric etch stop etching processes.

Figure 18:
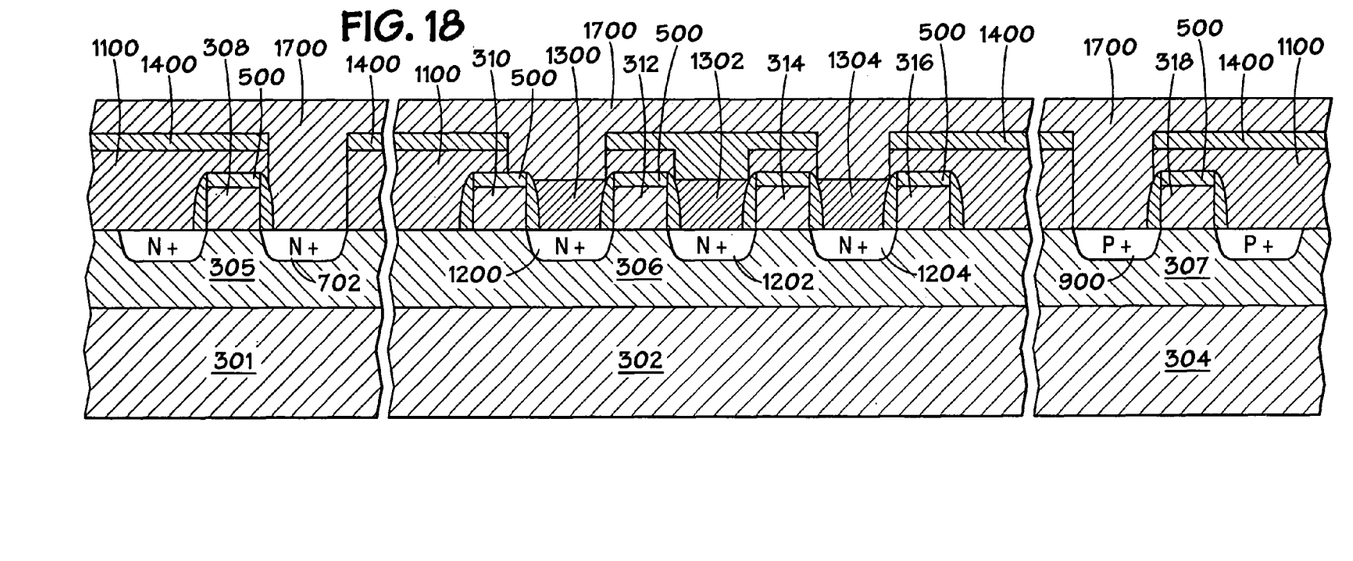

As an alternative embodiment, which is depicted in FIG. 18, the dielectric etch stop layer 500 may be formed as part of the NMOS gate 308, wordlines 310-316, and/or the PMOS gate 318. Beneficially, by including the dielectric etch stop layer 500 in the NMOS gate 308, wordlines 310-316, and the PMOS gate 318, the later etching processes may not have to be modified to penetrate the dielectric etch stop layer 500 in the array section 302. Accordingly, similar to the discussion above, the NMOS gate 308, wordlines 310-316, and the PMOS gate 318 may comprise a plurality of layers, such as a doped semiconductor layer, a first conductive layer, a second conductive layer, a cap layer, and a dielectric etch stop layer 500. In this approach, the etchant utilized to form the spacers 400-422 may be selective to the material utilized for the spacers 400-422 relative to the material in the dielectric etch stop layer 500. As such, the dielectric etch stop layer 500 may be formed as part of the NMOS gate 308, wordlines 310-316, and the PMOS gate 318 and provide protection to the wordline stack through the processing of the different structures.

Figure 19:
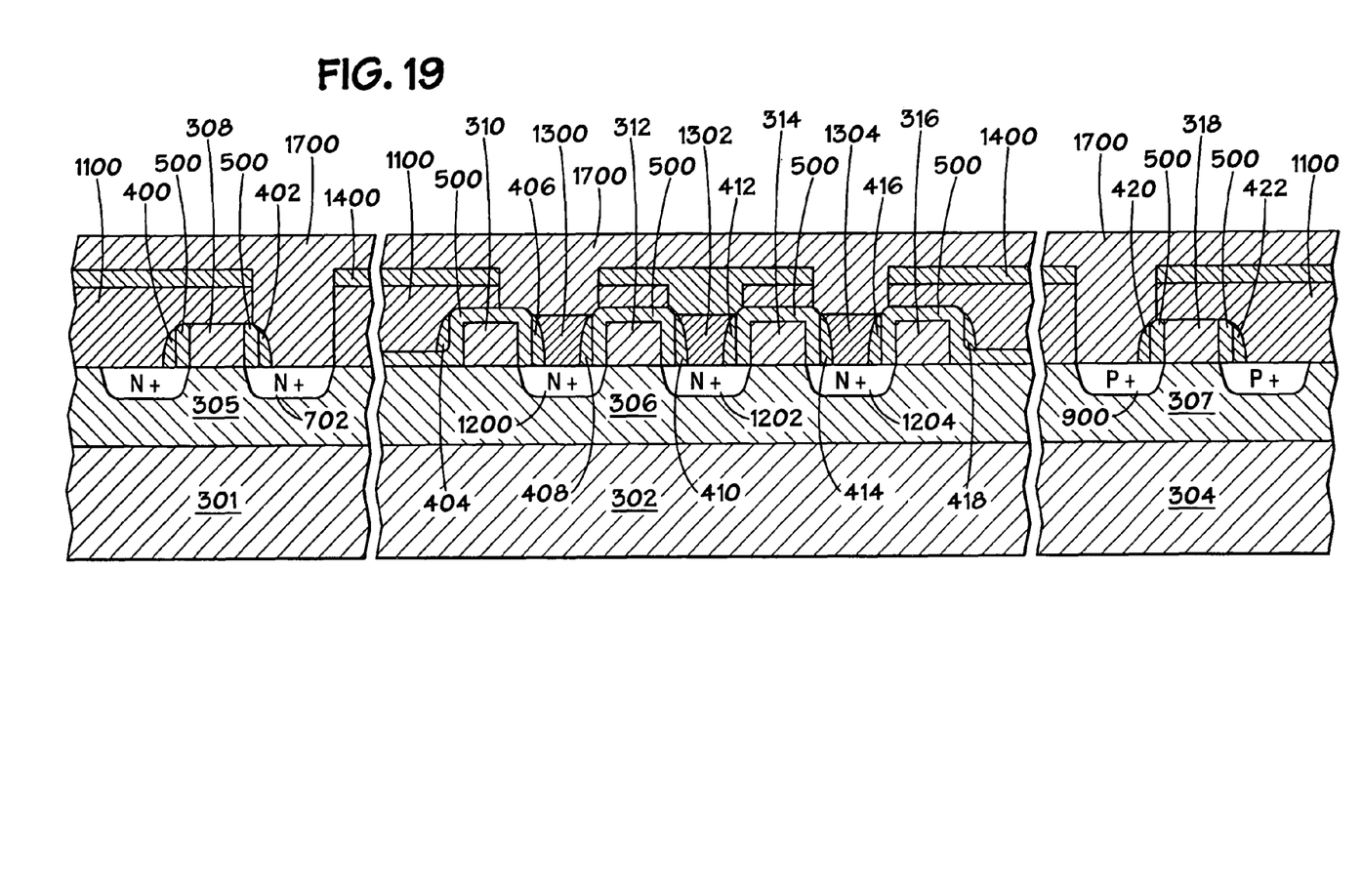

Also, as another alternative embodiment depicted in FIG. 19, the dielectric etch stop layer 500 may be deposited before the spacers 400-422 are formed. By depositing the dielectric etch stop layer 500 over the NMOS gate 308, wordlines 310-316, the PMOS gate 318 and sections 301-304, the spacers 400-422 may be formed over the dielectric etch stop layer 500 on either side of the NMOS gate 308, wordlines 310-316, and the PMOS gate 318. Again, in this approach, the etchant utilized to form the spacers 400-422 may be selective to the material utilized for the spacers 400-422 relative to the material in the dielectric etch stop layer 500.

Furthermore, it should be appreciated that the various fabrication steps may be altered or performed in a different order. For instance, the doping of the N+ doped regions 700 and 702 and/or P+ doped regions 900 and 902 may be performed before and/or after the removal of the dielectric etch stop layer 500 from the peripheral sections 301 and 304. Also, the photoresist 600 and/or 800 may be removed in the same etching process along with the dielectric etch stop layer 500. Accordingly, it should be appreciated that the fabrication steps may be altered.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device comprising:
an array portion of a substrate comprising a first plurality of spacers, a first plurality of wordlines associated with at least one of the first plurality of spacers, and a first plurality of active areas adjacent to at least one of the first plurality of wordlines, wherein a dielectric etch stop layer is deposited over each of a portion of the first plurality of spacers, a portion of the first plurality of wordlines, and a portion of the first plurality of active areas;
a peripheral portion of the substrate comprising a second plurality of spacers, a second plurality of wordlines associated with at least one of the second plurality of spacers, and a second plurality of active areas adjacent to at least one of the second plurality of wordlines; and
a conductive layer electrically coupled to at least one of the first plurality of active areas and one of at least one of the second plurality of active areas and at least one of the second plurality of wordlines, wherein the conductive layer forms an interconnect between the array portion and the peripheral portion.

2. The device, as set forth in claim 1, wherein the dielectric etch stop layer comprises an aluminum oxide ($Al_2O_3$) material.

3. The device, as set forth in claim 1, wherein the dielectric etch stop layer comprises a silicon carbide (SiC) material.

4. The device, as set forth in claim 1, wherein the dielectric layer comprising a tetraethylorthosilicate (TEOS) material.

5. The device, as set forth in claim 1, wherein the plurality of wordlines comprises a tungsten layer, a tungsten nitride layer, and a nitride layer.

6. The device, as set forth in claim 1, wherein the etch stop layer prevents shorts in between the conductive layer that is a buried digit layer and plurality of wordlines in misaligned connections.

7. The device, as set forth in claim 1, wherein the device is a memory device.

8. The device, as set forth in claim 1, wherein the device is an integrated circuit.

9. A system comprising:
a processor; and
a memory device coupled to the processor comprising:
an array portion of a substrate comprising a first plurality of wordlines, a first plurality of active areas adjacent to at least one of the first plurality of wordlines, and a first plurality of conductive plugs associated with the first plurality of active areas, wherein a dielectric etch stop layer is deposited over each of a portion of the first plurality of wordlines, a portion of the first plurality of active areas, and a portion of the first plurality of conductive plugs;
a peripheral portion of the substrate comprising a second plurality of wordlines and a second plurality of active areas adjacent to at least one of the second plurality of wordlines; and
a conductive layer electrically coupled to one of at least one of the first plurality of conductive plugs and at least one of the first plurality of active areas and at least one of the second plurality of active areas, wherein the conductive layer forms an interconnect between the array portion and the peripheral portion.

10. The system, as set forth in claim 9, wherein the dielectric etch stop layer comprises an aluminum oxide ($Al_2O_3$) material.

11. The system, as set forth in claim 9, wherein the memory device comprises a dynamic random access memory.

12. The system, as set forth in claim 9, wherein the processor is coupled to at least one of an input device, a display, and a communication port.

* * * * *